(12) United States Patent
Inoue

(10) Patent No.: US 6,339,187 B1
(45) Date of Patent: Jan. 15, 2002

(54) INFRARED SENSOR AND METHOD OF MANUFACTURING THE SAME

(75) Inventor: Kazuhiro Inoue, Moriyama (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/547,048

(22) Filed: Apr. 10, 2000

(30) Foreign Application Priority Data

Apr. 14, 1999 (JP) .............................. 11-106495

(51) Int. Cl.$^7$ .............................. H01L 35/28
(52) U.S. Cl. .............................. 136/225
(58) Field of Search .............................. 136/225, 226

Primary Examiner—Kathryn Gorgos
Assistant Examiner—Thomas H Parsons
(74) Attorney, Agent, or Firm—Ostrolenk, Faber, Gerb & Soffen, LLP

(57) ABSTRACT

A $SiO_2$ layer is formed on a heat sink section having a cavity by thermal oxidation and an aluminum oxide layer is formed on the $SiO_2$ layer by an electron beam evaporation process at a substrate temperature of 60° C. or less and at a deposition rate of 0.8 nm/s or less. The resulting aluminum oxide film is amorphous and has partial oxygen defects. The $SiO_2$ layer and the aluminum oxide layer constitute a heat insulating thin-film. A thermoelectric conversion element and an infrared-absorbing layer are formed on the heat insulating thin-film to form an infrared sensor. The infrared sensor can be produced at low production costs and has high sensitivity.

8 Claims, 5 Drawing Sheets

INFRARED SENSOR AND METHOD OF MANUFACTURING THE SAME

BACKGROUND OF THE INVENTION

1. Field of the Invention

The present invention relates to infrared sensors and to methods of manufacturing the same. In particular, the present invention relates to a thermoelectric infrared sensor having a diaphragm structure which is prepared by etching a sacrificial layer on a semiconductor substrate or under a thin film and to a method for making the same.

2. Description of the Related Art

FIGS. 1A and 1B are a plan view and a cross-sectional view, respectively, of a typical conventional thermoelectric infrared sensor 1. In the thermoelectric infrared sensor 1, a thermal insulating thin film 4 is provided on a heat sink frame 2 and a cavity section 3, and two types of metals or semiconductors 5 and 6 are alternately wired on the central portion of the thermal insulating thin film 4 to form a thermopile 9 comprising thermocouples connected in series. These metals or semiconductors 5 and 6 are connected at portions above the heat sink frame 2 to form cold junctions 7 of the thermocouples, and are also connected at portions above the cavity section 3 to form hot junctions 8 of the thermocouples. The cold and hot junctions are formed on the thermal insulating thin film 4. The thermopile 9 has external electrodes 11 at both ends. The hot junctions 8 are covered with an infrared-absorbing layer 10.

Infrared rays incident on the thermoelectric infrared sensor 1 are absorbed in the infrared-absorbing layer 10 to generate heat which is conducted to the hot junctions 8. Thus, a temperature difference is generated between the cold junctions 7 and hot junctions 8 formed above the heat sink 2, which produces an electromotive force between the external electrodes 11 of the thermopile 9. Suppose that the thermoelectromotive force generated at a junction (or a thermocouple) of two metals or semiconductor elements 5 or 6 at a temperature of T is represented by $\Phi(T)$, and the number of the hot junctions 8 and the cold junctions 7 is m, respectively. When the temperature at the hot junctions 8 is $T_W$ and the temperature at the cold junctions 7 is $T_C$, the electromotive force V generated between the external electrodes 11 of the thermopile 9 is represented by equation (1):

$$V = m[\Phi(T_W) - \Phi(T_C)] \tag{1}$$

When the temperature $T_C$ at the heat sink frame 2 is known, the temperature $T_W$ at the hot junctions 8 is determined from the electromotive force V generated between the external electrodes 11. Since the temperature of the infrared-absorbing layer 10 increases according to the dose of the infrared rays which are incident on the infrared sensor 1 and are absorbed in the infrared-absorbing layer 10, the dose of the infrared rays incident on the infrared sensor 1 can be determined by measuring the temperature $T_W$ at the hot junctions 8.

In general, in such an infrared sensor 1, the heat sink frame 2 is comprised of a silicon substrate and the heat insulating film 4 is composed of $SiO_2$ film having a low thermal conductivity. The $SiO_2$ film, however, has high compressive stress. When the heat insulating film 4 is formed of a single $SiO_2$ layer, the heat insulating film 4 may break in some cases.

Thus, in another conventional infrared sensor 12 shown in FIG. 2, a heat insulating film 4 on a silicon heat sink frame 2 comprises a $Si_3N_4$ layer 13, a $SiO_2$ layer 14, and a $Si_3N_4$ layer 15, a thermopile 9 is covered with a protective film 16, and an infrared-absorbing layer 10 is provided thereon. In this configuration, the $Si_3N_4$ layers 13 and 15 have tensile stress and the $SiO_2$ layer 14 has compressive stress. Thus, the stress of the heat insulating film 4 formed by laminating these layers is relaxed to avoid damage to the heat insulating film 4.

Since the $Si_3N_4$ layers 13 and 15 are formed by a low pressure CVD (LPCVD) process, the heat insulating film 4 composed of the $Si_3N_4$ layers 13 and 15 and the $SiO_2$ layer 14 is produced at high facility and production costs. As a result, the infrared sensor 12 is inevitably expensive.

In another infrared sensor 17 shown in FIG. 3, a heat insulating film 4 on a heat sink frame 2 is a multilayered film composed of $SiO_2$ layers and $Al_2O_3$ layers which are formed by an ion plating process. Also, in such a configuration, the tensile stress of the $Al_2O_3$ layers offsets the compressive stress of the $SiO_2$ layers to avoid damage to the heat insulating film 4.

Since the $Al_2O_3$ films have a high thermal conductivity, the heat generated by the infrared rays in an infrared-absorbing layer 10 dissipates to the heat sink frame 2 via the $Al_2O_3$ layers. Thus, an increase in the temperature at the hot junctions is suppressed. Accordingly, the sensitivity of the infrared sensor 17 is reduced.

SUMMARY OF THE INVENTION

Accordingly, it is an object of the present invention to provide an infrared sensor which can be produced at reduced production costs and which exhibits high sensitivity.

It is another object of the present invention to provide a method for manufacturing the infrared sensor.

According to an aspect of the present invention, an infrared sensor comprises a heat insulating thin-film, a heat sink section for supporting the heat insulating thin-film, and a thermoelectric infrared detecting element provided on the heat insulating thin-film, wherein the heat insulating thin-film comprises an insulating layer primarily composed of aluminum oxide having partial oxygen defects and a silicon oxide layer. The thermoelectric infrared detecting element converts thermal energy into electrical energy. Examples of such elements include thermopiles (thermocouples), pyroelectric elements, and bolometers.

Since the insulating layer primarily composed of aluminum oxide having partial oxygen defects exhibits tensile stress and a low thermal conductivity, the aluminum oxide insulating layer offsets the compressive stress of the silicon oxide layer which is another constituent of the heat insulating thin-film. Thus, the heat insulating thin-film exhibits a low thermal conductivity and is barely damaged. Accordingly, this infrared sensor has high mechanical strength and high sensitivity. The aluminum oxide having partial oxygen defects can be readily formed by a vacuum deposition process at reduced facility and production costs.

In this infrared sensor, the aluminum oxide having partial oxygen defects is preferably represented by equation (2):

$$Al_2O_{3-X} \tag{2}$$

wherein the subscript X indicates the rate of the oxygen defects and is within a range of $0.05 \leq X \leq 0.5$.

When X is outside of this range, the thermal conductivity of the aluminum oxide insulating layer increases.

According to another aspect of the present invention, an infrared sensor comprises a heat insulating thin-film, a heat sink section for supporting the heat insulating thin-film, and a thermoelectric infrared detecting element provided on the heat insulating thin-film, wherein the heat insulating thin-film comprises an insulating layer primarily composed of amorphous aluminum oxide and a silicon oxide layer.

Since the insulating layer primarily composed of amorphous aluminum oxide exhibits tensile stress and a low thermal conductivity, the amorphous aluminum oxide insulating layer offsets the compressive stress of the silicon oxide layer which is another constituent of the heat insulating thin-film. Thus, the heat insulating thin-film exhibits a low thermal conductivity and is barely damaged. Accordingly, this infrared sensor has high mechanical strength and high sensitivity. The amorphous aluminum oxide can be readily formed by a vacuum deposition process at reduced facility and production costs.

According to another aspect of the present invention, a method for making an infrared sensor comprises supporting a heat insulating thin-film comprising a silicon oxide layer and an aluminum oxide layer with a heat sink section, and providing a thermoelectric infrared detecting element on the heat insulating thin-film, wherein the aluminum oxide layer is formed by an electron beam evaporation process at a deposition rate of 0.8 nm/s or less.

By an electron beam evaporation process at a deposition rate of 0.8 nm/s or less, an aluminum oxide layer having partial oxygen defects or an amorphous aluminum oxide layer can be formed.

DESCRIPTION OF THE PREFERRED EMBODIMENTS

First Embodiment

Figure 1A:
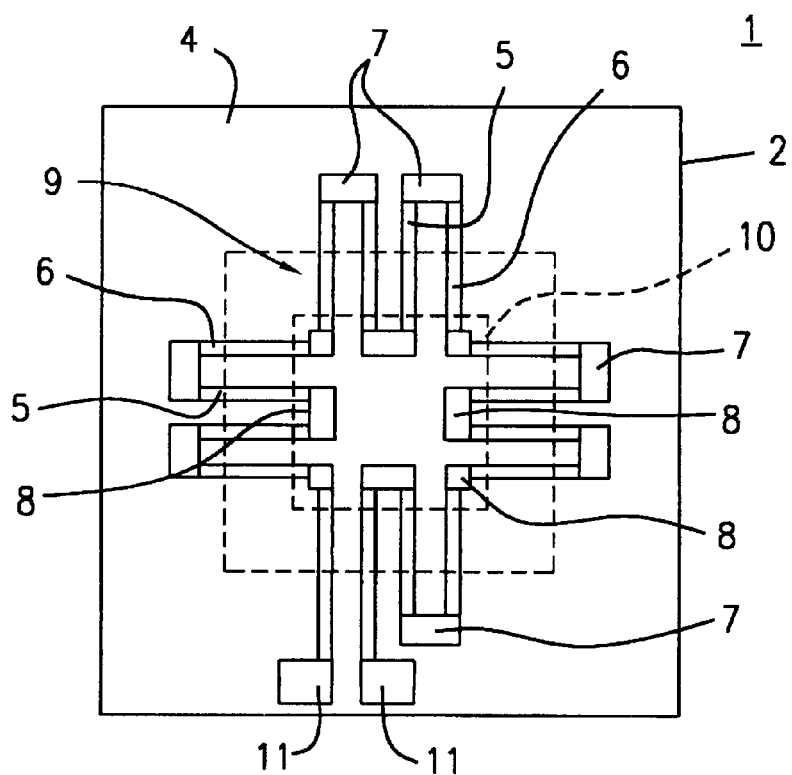
FIGS. 1A and 1B are a plan view and a cross-sectional view, respectively, of a typical conventional infrared sensor.
Figure 1B:
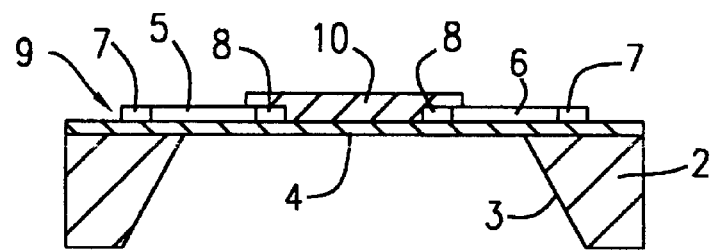
Figure 2:
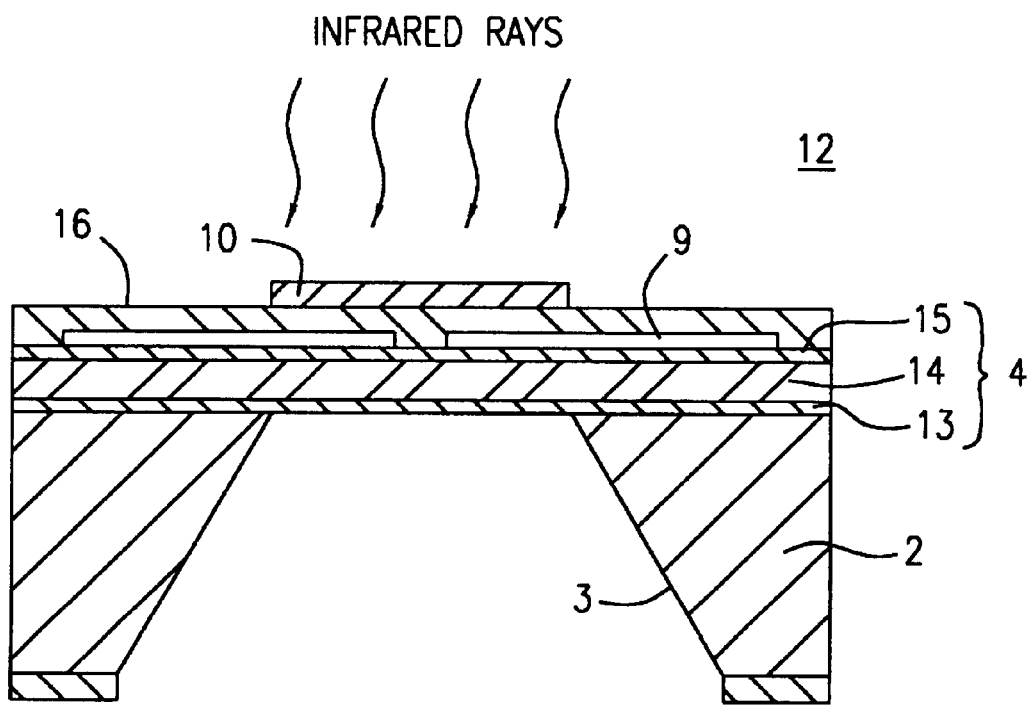
FIG. 2 is a cross-sectional view of another conventional infrared sensor.
Figure 3:
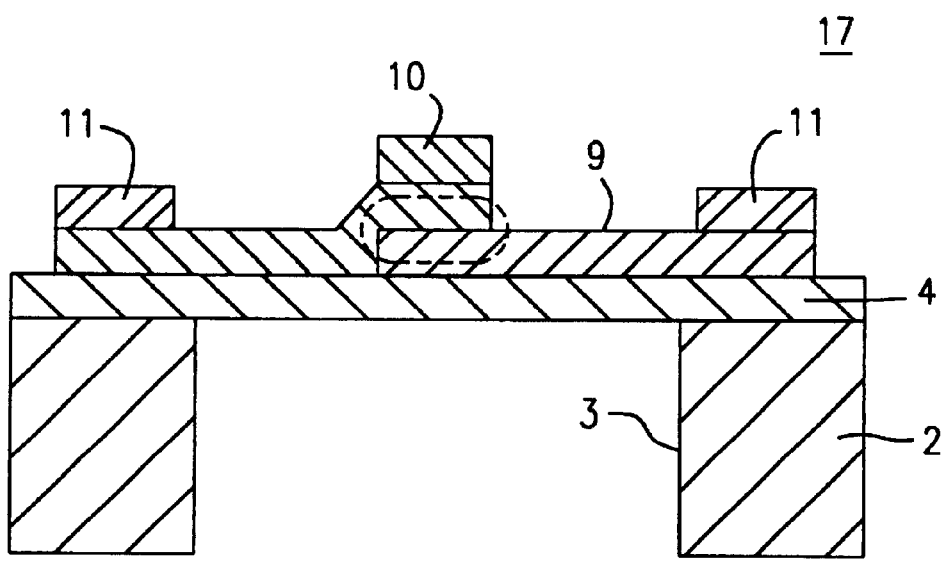
FIG. 3 is a cross-sectional view of another conventional infrared sensor.
Figure 4:
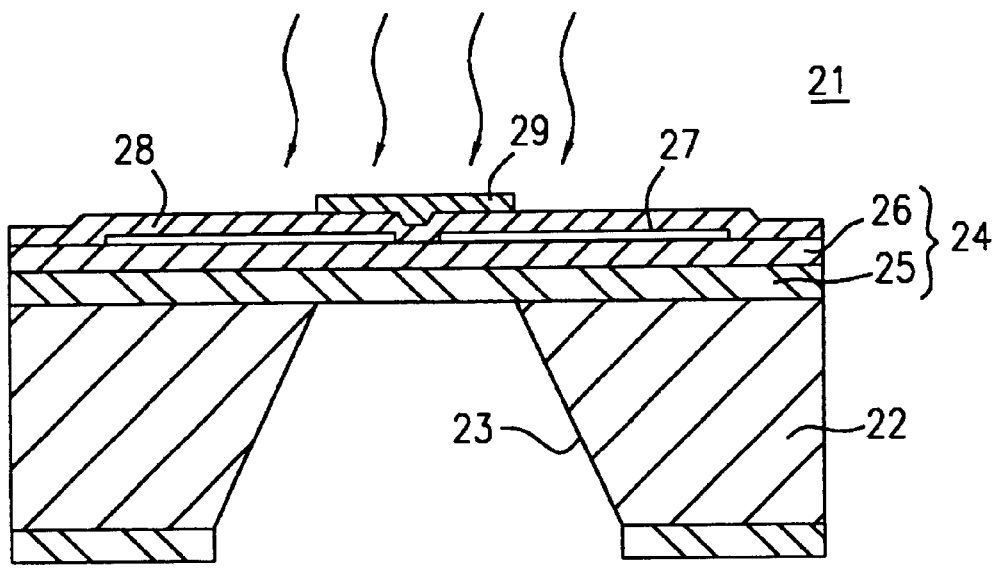
FIG. 4 is a cross-sectional view of an infrared sensor in accordance with an embodiment of the present invention.

FIG. 4 is a cross-sectional view of a thermoelectric infrared sensor 21 in accordance with a first embodiment of the present invention. The thermoelectric infrared sensor 21 has a heat sink frame 22, which is formed of a silicon substrate, having a central cavity 23, and a heat insulating thin-film 24 provided over the heat sink frame 22 and the cavity 23. The heat insulating thin-film 24 has a thickness of 1 μm or less to suppress the heat capacity thereof, and is composed of a $SiO_2$ layer 25 and an aluminum oxide layer 26 having partial oxygen defects, which is represented by $Al_2O_{3-X}$ wherein $X \neq 0$.

Preferably, X, which indicates the rate of the oxygen defects in the aluminum oxide layer, is in a range of $0.05 \leq X \leq 0.5$, and more preferably $0.1 \leq X \leq 0.4$. At $X \leq 0.05$, the thermal conductivity of the aluminum oxide layer 26 is substantially the same as that of $Al_2O_3$ not having oxygen defects and thus the heat insulation of the heat insulating thin-film 24 is insufficient. At $X > 0.5$, aluminum is enriched in the aluminum oxide layer 26 and thus the heat insulation of the heat insulating thin-film 24 is insufficient.

A thermoelectric conversion element 27 for measuring temperature is provided on the heat insulating thin-film 24 over the heat sink frame 22 and the cavity 23. The thermoelectric conversion element 27 may be a thermopile (thermocouples), a pyroelectric element, or the like. A protective film 28 composed of $SiO_2$ is formed on the thermoelectric conversion element 27. An infrared-absorbing layer 29 composed of metal black, e.g., Au black or Bi black, is formed on the protective film 28 above the edges (hot junctions) of the thermoelectric conversion element 27.

Second Embodiment

Figure 5:
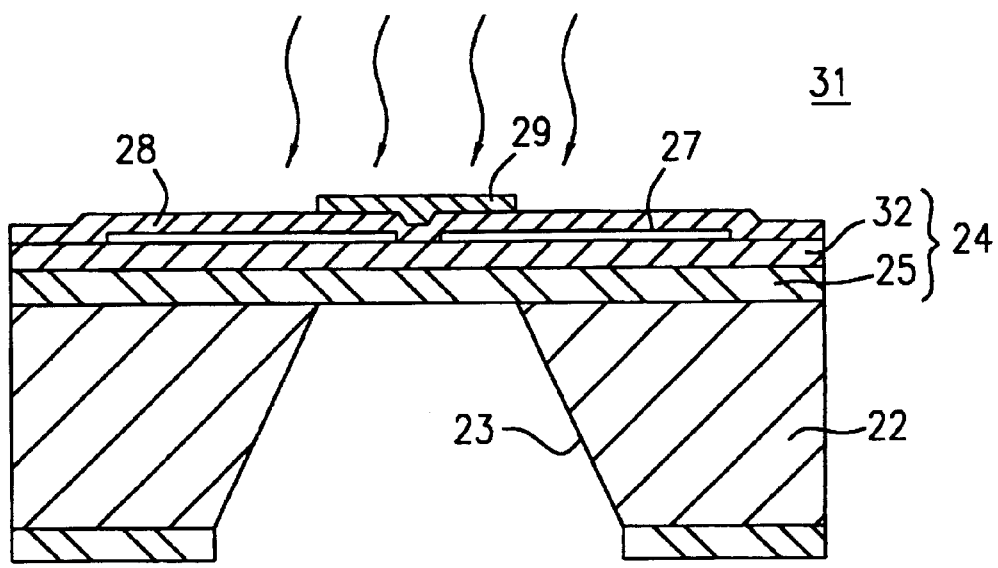
FIG. 5 is a cross-sectional view of an infrared sensor in accordance with another embodiment of the present invention.

FIG. 5 is a cross-sectional view of a thermoelectric infrared sensor 31 in accordance with a second embodiment of the present invention. The thermoelectric infrared sensor 31 has a heat sink frame 22, which is formed of a silicon substrate, having a central cavity 23, and a heat insulating thin-film 24 provided over the heat sink frame 22 and the cavity 23. The heat insulating thin-film 24 has a thickness of 1 μm or less to suppress the heat capacity thereof, and is composed of a $SiO_2$ layer 25 and an amorphous aluminum oxide layer 32.

The amorphous aluminum oxide layer 32 may or may not have oxygen defects. When the amorphous aluminum oxide layer 32 has oxygen defects, the amorphous aluminum oxide is represented by $Al_2O_{3-Y}$. The subscript Y indicating the rate of oxygen defects is preferably in a range of $0 \leq Y \leq 0.5$. At $Y > 0.5$, aluminum is enriched in the amorphous aluminum oxide layer 32 and thus the heat insulation of the heat insulating thin-film 24 is insufficient.

A thermoelectric conversion element 27 for measuring temperature is provided on the heat insulating thin-film 24 over the heat sink frame 22 and the cavity 23. The thermoelectric conversion element 27 may be a thermopile (thermocouples), a pyroelectric element, or the like. A protective film 28 composed of $SiO_2$ is formed on the thermoelectric conversion element 27. An infrared-absorbing layer 29 composed of metal black, e.g., Au black or Bi black, is formed on the protective film 28 above the edges (hot junctions) of the thermoelectric conversion element 27.

Operation of the First and Second Embodiments

When infrared rays are incident on the thermoelectric infrared sensor 21 of the first embodiment or the thermoelectric infrared sensor 31 of the second embodiment, the infrared rays are absorbed and are converted into heat in the infrared-absorbing layer 29. Since the heat insulating thin-film 24 has a low thermal conductivity, the heat does not dissipate toward the heat sink frame 22 and the temperature of the infrared-absorbing layer 29 increases. On the other hand, the heat sink frame 22 having a large heat capacity is maintained at a constant temperature. A temperature difference between the heat sink frame 22 and the infrared-absorbing layer 29 causes generation of an electromotive force in proportion to the intensity of the incident infrared rays. The potential difference due to this electromotive force is extracted by external electrodes (not shown in the drawings) and is measured as the dose of the infrared rays.

In the above embodiments, the dose of the infrared rays is measured using a thermoelectric conversion element. A thin-film thermal detector such as a pyroelectric element or a bolometer element may be used instead of the thermoelectric conversion element.

Table 1 shows thermal conductivity of $SiO_2$, $Si_3N_4$, polycrystalline $Al_2O_3$, amorphous aluminum oxide, and aluminum oxide having partial oxygen defects.

TABLE 1

| Material | Thermal Conductivity (W/cm · ° C.) |
|---|---|
| SiO$_2$ | 0.01 |
| Si$_3$N$_4$ | 0.12 |
| Polycrystalline Al$_2$O$_3$ | 0.24 |
| Amorphous aluminum oxide | 0.02 to 0.04 |
| Aluminum oxide having partial oxygen defects | 0.02 to 0.04 |

As shown in Table 1, the thermal conductivities of the amorphous aluminum oxide and the aluminum oxide having partial oxygen defects are lower than those of polycrystalline Al$_2$O$_3$ and Si$_3$N$_4$.

Table 2 shows the tensile stress of SiO$_2$, polycrystalline Al$_2$O$_3$, amorphous aluminum oxide, and aluminum oxide having partial oxygen defects, wherein compression stress is represented as a negative value.

TABLE 2

| Material | Tensile Stress (MPa) |
|---|---|
| SiO$_2$ | −430 |
| Polycrystalline Al$_2$O$_3$ | +100 to +200 |
| Amorphous aluminum oxide | +400 |
| Aluminum oxide having partial oxygen defects | +400 |

As shown in Table 2, the tensile stresses of the amorphous aluminum oxide and the aluminum oxide having partial oxygen defects are higher than that of polycrystalline Al$_2$O$_3$.

As shown in Tables 1 and 2, the SiO$_2$ layer 25 is highly insulating and exhibits high compressive stress. In the heat insulating thin-film 24, the amorphous aluminum oxide layer 32 or the aluminum oxide layer 26 having partial oxygen defects, which has high tensile stress, offsets the compressive stress of the SiO$_2$ layer 25 to avoid damage to the heat insulating thin-film 24 due to stress, even when the amorphous aluminum oxide layer 32 or the aluminum oxide layer 26 having partial oxygen defects is thin.

The thermal conductivity of the amorphous aluminum oxide layer 32 and the aluminum oxide layer 26 having partial oxygen defects is lower than that of the polycrystalline Al$_2$O$_3$ and Si$_3$N$_4$. Thus, the heat insulating thin-film 24 composed of a combination of the SiO$_2$ layer 25 and one of these layers does not dissipate heat generated by infrared rays toward the heat sink frame 22. Since the temperature of the infrared-absorbing layer 29 is effectively increased, the detection sensitivity is high.

The aluminum oxide layer having partial oxygen defects 26 or the amorphous aluminum oxide layer 32 can be readily formed by an electron beam evaporation process which is a low cost production process, and thus the infrared sensors 21 and 31 can be produced at low production costs.

Figure 6A:
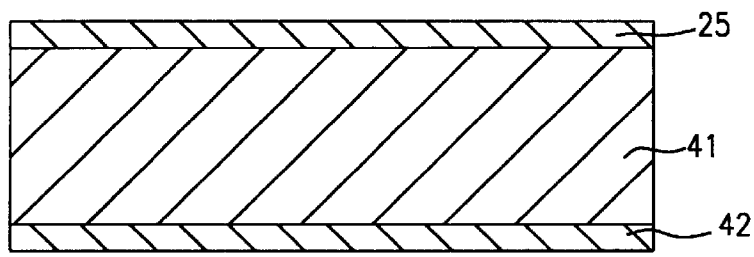
FIGS. 6A to 6G are cross-sectional views for illustrating a method for making an infrared sensor in accordance with the present invention.
Figure 6B:
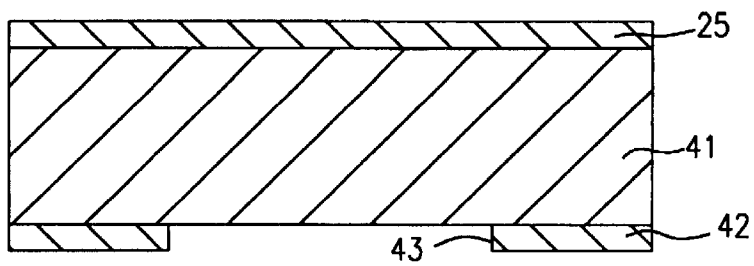
Figure 6C:
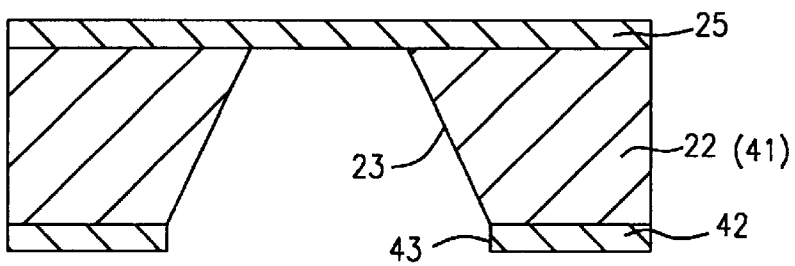

A method for making the infrared sensors 21 and 31 of the first and second embodiments will now be described with reference to FIGS. 6A to 6G. A silicon substrate 41 is thermally oxidized to form SiO$_2$ films 25 and 42 having a thickness of 0.5 μm on the two faces thereof (FIG. 6A). The center of the SiO$_2$ film 42 on the back face is etched by a photolithographic process to form an opening 43 (FIG. 6B). The exposed back side of the silicon substrate 41 is anisotropically etched using a potassium hydroxide solution to form a cavity 23 in the silicon substrate 41 and the SiO$_2$ layer 25 is simultaneously thinned to form a diaphragm structure. The residual silicon substrate 41 functions as a heat sink frame 22 (FIG. 6C).

Figure 6D:
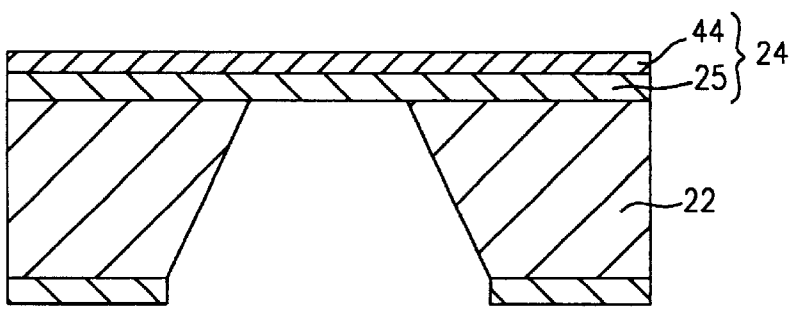

An aluminum oxide insulating layer 44 having a thickness of 0.3 μm is formed on the SiO$_2$ layer 25. The aluminum oxide insulating layer 44 is formed by, for example, an electron beam evaporation process using aluminum oxide as an evaporation source at a substrate temperature of 60° C. or less and a deposition rate of 0.8 nm/s or less. The resulting aluminum oxide insulating layer 44 is amorphous and has partial oxygen defects. Accordingly, a double-layered heat insulating thin-film 24 composed of the SiO$_2$ layer 25 and the aluminum oxide insulating layer 44 is formed on the heat sink frame 22 (FIG. 6D).

Figure 6E:
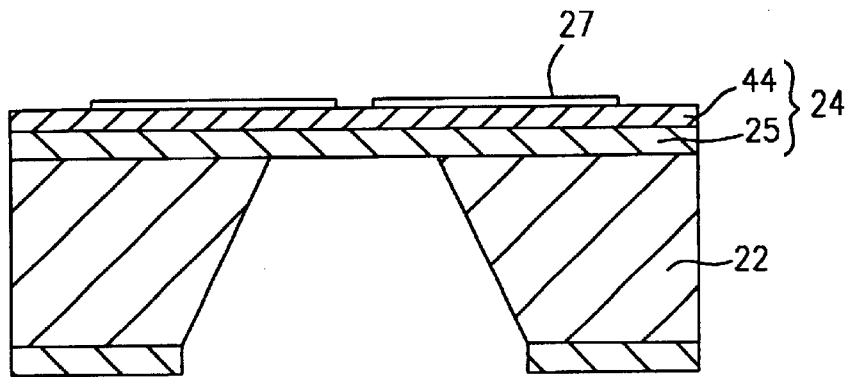
Figure 6F:
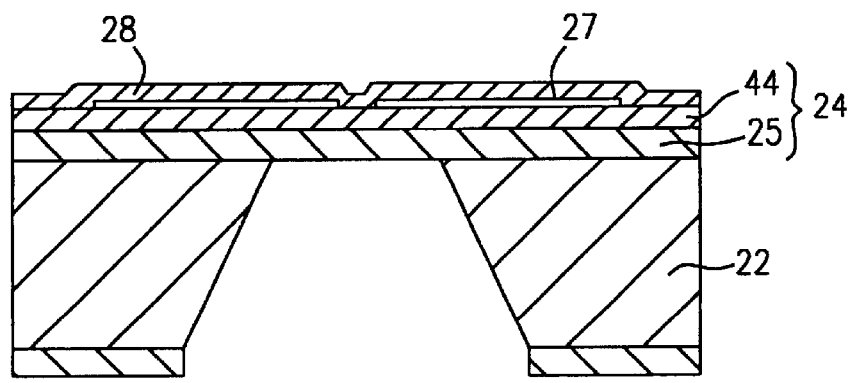
Figure 6G:
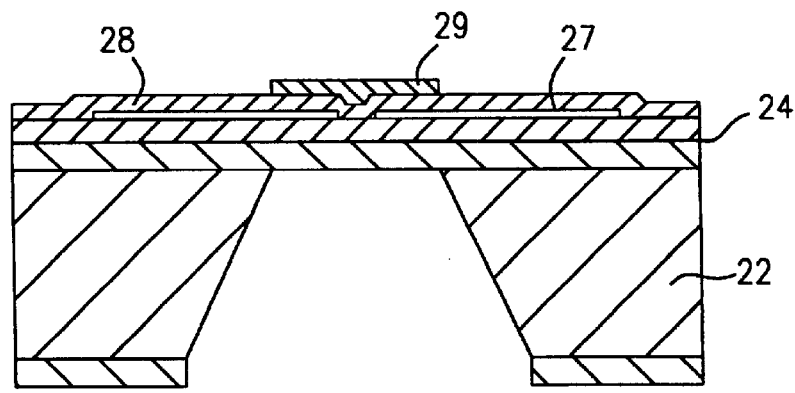

A thermoelectric conversion element (thermopile) 27 composed of a metal resistive film and a semiconductor thin-film is formed on the heat insulating thin-film 24 (FIG. 6E). A protective film 28 composed of silicon oxide with a thickness of 0.5 μm is formed on the thermoelectric conversion element 27 by a radiofrequency (RF) sputtering process (FIG. 6F). External electrodes are provided to the thermoelectric conversion element 27 and an infrared-absorbing layer 29 is formed on the protective film 28 to form a thermoelectric infrared sensor 21 (FIG. 6G). Any other thermoelectric infrared detecting element can be used instead of the thermoelectric conversion element.

In a conventional process, the aluminum oxide layer is formed at a deposition rate of 1.00 nm/s or more. In contrast, the aluminum oxide insulating layer 44 of the present invention is formed at a low deposition rate of 0.8 nm/s or less so that the aluminum oxide insulating layer 44 is amorphous and has partial oxygen defects. Thus, the aluminum oxide insulating layer 44 corresponds to the aluminum oxide layer 26 having partial oxygen defects in the first embodiment and to the amorphous aluminum oxide layer 32 in the second embodiment. The heat insulating thin-film 24 including such an aluminum oxide insulating layer 26 or 32 is suitable for an infrared sensor.

The heat insulating film 24 is composed of a single SiO$_2$ layer and a single aluminum oxide layer in the above embodiments. Alternatively, aluminum oxide insulating layers and SiO$_2$ layers may be alternately deposited, for example, an aluminum oxide insulating layer, a SiO$_2$ layer, and another aluminum oxide insulating layer, or a SiO$_2$ layer, an aluminum oxide insulating layer, and another SiO$_2$ layer.

What is claimed is:

1. An infrared sensor comprising:
   a heat insulating thin-film;
   a heat sink section supporting the heat insulating thin-film; and
   a thermoelectric infrared detecting element on the heat insulating thin-film;
   wherein the heat insulating thin-film comprises an insulating layer comprising an aluminum oxide layer having partial oxygen defects and a silicon oxide layer, and
   wherein the aluminum oxide layer is amorphous aluminum oxide or has partial oxygen defects or both.

2. An infrared sensor according to claim 1, wherein said aluminum oxide has partial oxygen defects.

3. An infrared sensor according to claim 2, wherein said aluminum oxide having partial oxygen defects is represented by Al$_2$O$_{3-X}$ wherein $0.05 \leq X \leq 0.5$.

4. An infrared sensor according to claim 1, wherein said aluminum oxide is amorphous aluminum oxide.

5. An infrared sensor according to claim 4, wherein said aluminum oxide is represented by Al$_2$O$_{3-Y}$ wherein $0 \leq Y \leq 0.5$.

6. An infrared sensor according to claim 5, wherein Y is greater than 0.

7. A method for making an infrared sensor comprising:

supporting a heat insulating thin-film comprising a silicon oxide layer and an aluminum oxide layer with a heat sink section; and providing a thermoelectric infrared detecting element on the heat insulating thin-film;

wherein the aluminum oxide layer is amorphous or has oxygen defects or both.

8. The method according to claim 7, further comprising forming the aluminum oxide layer by electron beam evaporation at a deposition rate of 0.8 nm/s or less.

* * * * *